INTERCHANNEL NOISE SUPPRESSOR CIRCUITS

Filed Nov. 24, 1948 2 SHEETS—SHEET 1

INVENTOR
BENJAMIN S. VILKOMERSON
BY Philip J. Cooper
ATTORNEY

INVENTOR
BENJAMIN S. VILKOMERSON
BY Philip G. Cooper
ATTORNEY

Patented Mar. 3, 1953

2,630,527

UNITED STATES PATENT OFFICE 2,630,527

INTERCHANNEL NOISE SUPPRESSOR CIRCUITS

Benjamin S. Vilkomerson, Camden, N. J., assignor to Radio Corporation of America, a corporation of Delaware Application November 24, 1948, Serial No. 61,864

3 Claims. (Cl. 250—20)

This invention relates to muting circuits for broadcast receivers and particularly to combined interchannel noise suppressor and tuning indicator circuits for amplitude-modulated (a-m) or frequency-modulated (f-m) carrier wave receivers.

It has long been recognized that it is desirable to mute the audio channel of a broadcast receiver while the receiver is tuned between adjacent channels. Furthermore, the receiver should be muted when the amplitude of the received carrier wave falls below a predetermined value where the wave would be below marginal utility. Another requirement of a noise muting or interchannel noise suppression circuit is that the audio channel should not be opened by intermittent noise pulses even when they have high peak amplitudes. On the other hand, when the audio channel is opened by a carrier wave of sufficient amplitude it should not close again when the amplitude of the carrier wave decreases momentarily. A further requirement of an interchannel noise suppressor circuit is that the audio channel should be suddenly opened completely and should not remain in a semi-conducting condition when a carrier wave of marginal utility is received. Numerous muting circuits have been devised heretofore but none of them meets all the above requirements.

The importance of the proper tuning of an f-m receiver has also long been recognized. In order to secure the best signal-to-noise ratio and the minimum amount of audio distortion the receiver should be tuned so that the center frequency of the f-m wave coincides with the assigned center frequency of the discriminator which, in turn, should be equal to the frequency of the center of the passband of the intermediate-frequency coupling circuits. At the present time the frequency departure of an f-m broadcast wave from its assigned center frequency amounts to a maximum of 75 kilocycles (kc.) in either direction from the center frequency. Although the intermediate-frequency passband usually has a width of 200 kc., which is more than the width of the f-m wave band, the f-m wave should be accurately centered on the intermediate-frequency passband to allow for unavoidable drift of the local oscillator and to minimize the effect of non-linearity in the discriminator characteristic. It is just as important to provide proper tuning of an a-m receiver in order to prevent distortion of the reproduced signal.

It is accordingly an object of the present invention to provide novel muting circuits for a broadcast receiver, whereby the audio channel of the receiver is normally inoperative and is suddenly opened or rendered fully operative in response to the reception of a carrier wave having a predetermined and adjustable minimum average amplitude, the circuit being arranged in such a manner that even high intermittent noise peaks will not open the audio channel while a momentary reduction of the amplitude of the received carrier wave will not close a previously opened audio channel.

Another object of the invention is to provide a muting circuit of the type described where the muting amplifier serves the additional function of rendering a normally inoperative electronic tuning indicator operative in response to the reception of a carrier wave.

A further object of the invention is to provide a combined interchannel noise suppressor and tuning indicator circuit for an a-m or f-m rereceiver where the muting amplifier of the noise suprressor circuit will control the tuning indicator tube to render it operative when a carrier wave is received and where further means are provided to indicate visually the extent and sense of mistuning of the receiver.

A modulated carrier wave receiver in accordance with the present invention may include a detector and a normally inoperative audio amplifier, the detector having a common cathode with the audio amplifier. The load circuit of the detector controls a muting amplifier which is normally conducting. Furthermore, a predetermined bias voltage is impressed on the control grid of the muting amplifier. The cathode circuits of the muting amplifier and of the combined detector and audio amplifier have a common impedance. Consequently, when a carrier wave whose positive peak value exceeds the cathode potential is received, the negative direct current voltage developed across the detector load circuit biases the grid and thus reduces the space current flowing through the muting amplifier. This will, in turn, reduce the cathode potential of the detector so that the relative peak radio-frequency potential of the signal will increase. Accordingly, a larger direct-current voltage is developed across the detector load circuit which further reduces the space current through the muting amplifier. The muting amplifier is thus suddenly cut off while the audio amplifier channel is just as suddenly opened. The predetermined bias voltage applied to the muting amplifier control grid determines the minimum average peak amplitude of a carrier wave which will open the audio channel.

The muting amplifier may be coupled to an electronic tuning indicator tube to render its target bright when a carrier wave is received. The tuning indicator tube will indicate the amount and sense of mistuning of the receiver. Furthermore, the muting circuit and indicator tube of the invention may be applied to an FM receiver.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 1:
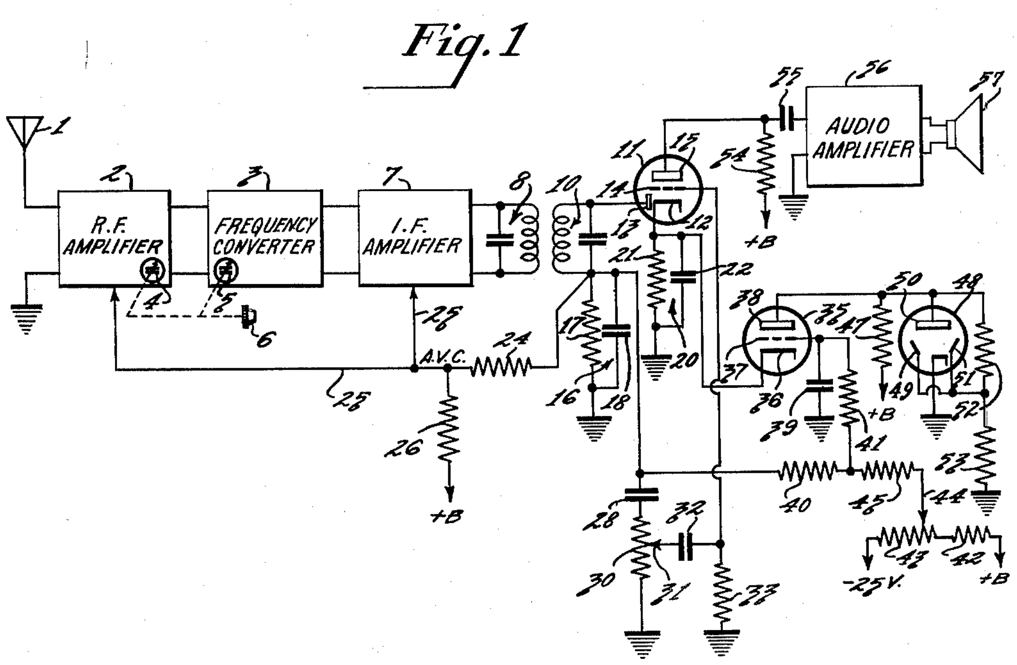
Fig. 1 is a circuit diagram, partly in block form, of an a-m receiver embodying the present invention.

Referring now to the drawings in which like components have been designated by the same reference numerals, and particularly to Fig. 1 there is illustrated an a-m receiver comprising antenna 1 for intercepting an a-m wave. The wave may be amplified by one or more radio-frequency (r-f) amplifiers 2 and converted to an intermediate-frequency (i-f) wave by frequency converter 3 including a beat frequency or local oscillator. R-f amplifier 2 and the local oscillator of frequency converter 3 are tunable to the desired frequency by variable reactances such as capacitors 4 and 5. Capacitors 4 and 5 are variable in unison by tuning control knob 6 in accordance with conventional practice.

The i-f wave derived from converter 3 may be amplified by i-f amplifier 7 having a tuned output circuit 8 magnetically coupled to input circuit 10 of the detector. The detector includes tube 11 which preferably is a combined diode-triode as illustrated. Tube 11 has a common cathode 12 for its diode and triode sections. Anode 13 forms the diode section with cathode 12 while the triode section further includes control grid 14 and anode 15.

A detector load circuit 16 consists of resistor 17 shunted by capacitor 18 and is arranged in series with input circuit 10 and effectively between anode 13 and cathode 12. Actually, one terminal of load circuit 16 is grounded while cathode 12 is connected to ground through self-bias network 20 including resistor 21 shunted by capacitor 22. An automatic gain control voltage (AVC voltage) is derived across load circuit 16 and may be impressed through resistor 24 and leads 25, 25 on r-f amplifier 2 and i-f amplifier 7 in accordance with conventional practice. A positive delay voltage for the AVC circuit is introduced through dropping resistor 26 having one terminal connected to a suitable voltage source which may have a voltage of 100 volts, indicated at +B, while its other terminal is connected to leads 25. The purpose of the AVC delay voltage will be explained hereinafter.

The modulation or audio signal is also developed across detector load circuit 16. The audio signal without its direct current component is impressed upon control grid 14 of the triode amplifier section. For this purpose the high potential terminal of detector load circuit 16 is connected to ground through audio coupling capacitor 28 and potentiometer 30 which functions as the volume control. The audio signal is obtained through variable tap 31 connected to control grid 14 through audio coupling capacitor 32. Grid leak resistor 33 is connected between control grid 14 and ground.

In accordance with the present invention there is provided control or muting amplifier 35 having cathode 36, control grid 37 and anode 38. Cathode 36 is connected to cathode 12 of diode-triode 11. The direct current component of the signal voltage as developed across load circuit 16 is impressed on control grid 37 through resistors 40, 41 connected to the high potential terminal of load circuit 16.

The control grid 37 of muting amplifier 35 is also supplied with a predetermined bias voltage. To this end there is provided a potentiometer including resistors 42 and 43 connected in series between a positive voltage source indicated at +B and a negative voltage source of —25 volts as indicated. By means of variable tap 44 on resistor 43 a voltage of predetermined polarity and magnitude may be derived and impressed through resistors 45 and 41 on control grid 37. Actually, the series combination of resistors 45, 40 and 17 forms a voltage divider having one terminal connected to ground, the direct current component of the signal developed acdoss load resistor 17 being in series with the voltage of potentiometer 43.

Anode 38 of muting amplifier 35 is connected to +B through dropping resistor 47. A double vane indicator tube 48 of the electronic shadow type has its target 50 connected to anode 38 of muting tube 35. The two control rods 49, 51 of indicator tube 48 are connected together. Resistor 52 is provided between target 50 and control rods 49, 51, while resistor 53 connects the control rods to ground.

Anode 15 of the triode section of tube 11 is connected to +B through load resistor 54 across which the amplified audio signal is developed which is coupled through capacitor 55 to audio amplifier 56 and reproduced by loud speaker 57.

The muting circuit of the receiver of Fig. 1 operates as follows. The bias applied to the control grid 37 of muting amplifier 35 is adjusted by means of tap 44 to such a value that the amplifier 35 is normally conducting. Muting amplifier 35 preferably has a high mutual conductance so that a large variation of its plate current is caused by a variation of its grid voltage. Furthermore, audio amplifier 12, 14, 15 has a higher amplification factor than that of muting amplifier 35. A high amplification factor as distinguished from the mutual conductance means that the plate voltage variation due to a variation of the grid voltage is large; hence a relatively small change in grid bias will change the tube from the amplifying to the cut-off condition.

The space current which normally flows through muting amplifier 35 will develop a predetermined voltage across bias network 20 which may be of the order of 5 volts. Accordingly, audio amplifier 12, 14, 15 is completely biased off because its control grid is 5 volts negative with respect to its cathode and the tube characteristic is such that only about 3 volts is necessary to cut off its plate current. Let it now be assumed that an amplitude-modulated carrier wave is tuned in by rotation of tuning control knob 6. If the average peak amplitude of the a-m wave impressed through input circuit 10 on detector 12, 13 exceeds 5 volts, detection will take place. If the average peak amplitude of the received wave is less than 5 volts, no rectification can take place because cathode 12 is 5 volts above ground while anode 13 is normally, that is, in the absence of a signal, substantially at ground potential.

As soon as the received carrier wave is detected, an audio signal is developed across detector load circuit 16. The rectified signal current will develop a voltage of negative polarity at the high potential terminal of load circuit 16, and this negative voltage is impressed through resistors 40 and 41 upon control grid 37 of muting amplifier 35. Consequently, the space current flowing through muting amplifier 35 is reduced thereby reducing the voltage drop across bias network 20. The result is that the positive voltage of cathode 12 with respect to ground is reduced. This will increase the efficiency of rectification of diode 12, 13 thereby causing a larger negative voltage to be applied to the control grid of muting tube 35 which is thus very rapidly cut off. This, in turn, will render the audio amplifier 12, 14, 15 suddenly conducting because its cathode potential approaches ground potential which is the normal potential of grid 14.

The audio channel is accordingly instantaneously opened as soon as a wave is received having a mean amplitude which is larger than a predetermined minimum value. This minimum value is adjustable by means of tap 44 so that carrier waves of less than marginal utility can be prevented from opening the audio channel. The audio channel will open suddenly so that it is either fully opened or fully closed and no semi-conducting condition can exist.

The time constant of resistor 41 and capacitor 39 in the grid circuit of control grid 37 is large compared to a cycle of the modulation signal and may be of the order of .1 second. Consequently, intermittent noise pulses of high peak amplitude cannot open the audio channel because they cannot develop a negative voltage across resistor 41 and capacitor 39 which is sufficient to cut off the muting amplifier. On the other hand, even relatively weak continuous carrier waves will be able to open the audio channel as long as their mean amplitude exceeds the predetermined minimum value.

The delay voltage injected through resistor 26 on AVC leads 25, 25 has the following function. Normally, that is, in the absence of a carrier wave or in the presence of a carrier wave below the predetermined minimum amplitude, no AVC voltage is developed. Accordingly, the resonant circuits on which the AVC voltage is impressed, are damped due to the small residual bias of the grids, and this will reduce the amplification in r-f amplifier channel 2 and in i-f amplifier channel 7. However, as soon as a carrier wave is received which has an average amplitude above the predetermined minimum value, an AVC voltage is developed which will overcome the delay voltage. Now, the resonant circuits to which the AVC voltage is applied are no longer damped so that the amplification of the wave through the r-f and i-f channels is increased. This action of the AVC circuit will further aid in suddenly opening the audio channel.

Tuning indicator tube 48 is normally inoperative, that is, as long as muting amplifier 35 is conducting space current. In that case, the voltage drop across resistor 47 will lower the voltage of target 50 to such an extent that electrons are not attracted by the target and the target will remain dark. However, when muting amplifier 35 is cut off, the voltage applied to target 50 becomes sufficiently high to attract the electrons. Control rods 49, 51 are connected together and maintained through potentiometer 52, 53 at such a positive potential that they will not cast a shadow on target 50. Thus, every time a station is tuned in, target 50 will light up to indicate the presence of a carrier wave of sufficient amplitude even if volume control tap 31 is turned down so that no sound is heard from loud speaker 57.

Figure 2:
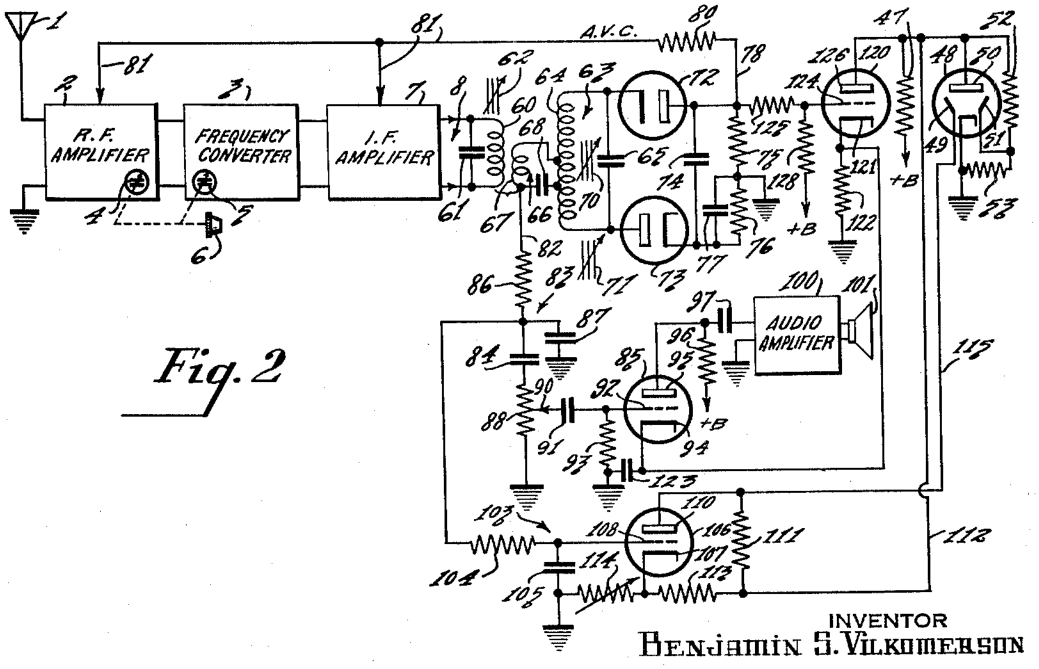
Fig. 2 is a circuit diagram, partly in block form, of an f-m receiver including a combined muting and tuning indicator circuit in accordance with the present invention.

Fig. 2 illustrates an f-m receiver provided with the muting circuit of the present invention. The tuning indicator circuit included in the receiver of Fig. 2 has been disclosed and claimed in the copending application to B. S. Vilkomerson, Serial No. 24,371, filed on April 30, 1948, now U. S. Patent 2,502,293 issued on March 28, 1950 and assigned to the assignee of this application. An f-m wave may be intercepted by antenna 1 and amplified by r-f amplifier stage 2. The r-f wave derived from amplifer 2 is converted by frequency converter 3 to an i-f wave which is further amplified by one or more i-f amplifiers 7. R-f amplifier 2 and the local oscillator of frequency converter 3 are tunable to the desired frequency by variable reactances such as capacitors 4 and 5, variable in unison by tuning control knob 6 in accordance with conventional practice.

The last i-f amplifier stage 7 has an output circuit 8 comprising coil 60 tuned by capacitor 61. The inductance of coil 60 may be adjusted by paramagnetic core 62. I-f output circuit 8 forms the primary circuit of a frequency discriminator network which includes secondary circuit 63 comprising coil 64 tuned by capacitor 65. Primary circuit 8 and secondary circuit 63 are coupled to each other by link circuit 66 comprising coil 67 and capacitor 68 arranged in series. Coils 60 and 67 are magnetically coupled as indicated. One terminal of coil 67 is connected to coil 64 at a tap on one side of its midpoint. The other terminal of coil 67 is coupled through capacitor 68 to another tap on coil 64 which is closely adjacent but on the other side of the midpoint of coil 64. Primary circuit 8 and secondary circuit 63 preferably are individually magnetically shielded. Thus, coils 60 and 64 are not magnetically coupled but are coupled through link circuit 66. By means of paramagnetic core 70, coil 64 may be electrically balanced. Paramagnetic core 71 serves the purpose of adjusting the resonant frequency of secondary circuit 63. The balance of coil 64 may have to be readjusted by core 70 after the circuit is tuned by core 71.

The frequency discriminator network including primary circuit 8 and secondary circuit 63 forms part of a frequency discriminator. Preferably, the frequency discriminator is of the ratio detector type which has been described by Stuart Wm. Seeley on page 26 of the December 1947 issue of "FM and Television." The ratio detector illustrated in Fig. 2 comprises two rectifiers such as vacuum diodes 72 and 73. The cathode of diode 72 is connected to one terminal of secondary circuit 63 while its other terminal is connected to the anode of diode 73. Stabilizing capacitor 74 is connected between the anode of diode 72 and the cathode of diode 73. Stabilizing capacitor 74 is shunted by resistors 75, 76 having their junction point grounded as shown. Stabilizing capacitor 74 presents a low impedance to intermediate-frequency and modulation-frequency currents. Stabilizing capacitor 74 and resistors 75, 76 are chosen in such a manner that they have a time constant which is larger than a cycle of the modulation frequency and which may be of the order of 0.1 second. Capacitor 77 bypasses resistor 76 and has a low impedance to intermediate-frequency currents but a high impedance to modulation-frequency currents.

The ratio detector of Fig. 2 operates in a conventional manner. The frequency discriminator network is balanced at the center frequency, that is, at the center frequency the carrier frequency voltages impressed upon diodes 72 and 73 are of equal magnitude. Accordingly, the voltage at the junction point of coil 67 and capacitor 68 will be equal to that of the junction point of resistors 75, 76 which is at ground potential. However, when the instantaneous frequency of the f-m wave deviates from its center frequency, the frequency discriminator network becomes unbalanced and the voltage impressed upon diode 72 will be unequal to that impressed upon diode 73. Accordingly, the voltage of the junction point of capacitor 68 and coil 67 will no longer be zero with respect to ground.

When an f-m wave is received, a voltage is developed across stabilizing capacitor 74 and resistors 75, 76 which varies slowly with changes in amplitude of the received wave. Thus, an AVC voltage may be derived from lead 78 which is connected to the junction point between resistor 75 and the anode of diode 72. The AVC voltage may be impressed in a conventional manner through filter resistor 80 upon i-f amplifier 7 and r-f amplifier 2, as indicated, by leads 81, 81.

The demodulated or audio signal may be obtained from lead 82 connected to the junction point between coil 67 and capacitor 68 and fed through de-emphasis network 83 and coupling capacitor 84 to audio amplifier 85. De-emphasis network 83 comprises series resistor 86 and shunt capacitor 87. It is conventional practice to provide a pre-emphasis network in one of the audio amplifier of an f-m transmitter which attenuates audio frequencies below 1500 cycles more than higher frequencies. De-emphasis network 83 is conventionally provided in an f-m receiver for the purpose of attenuating audio frequencies above 1500 cycles more than the lower audio frequencies to establish again the proper balance of the audio signal.

The audio signal derived from de-emphasis network 83 and coupling capacitor 84 is developed across potentiometer 88 connected between coupling capacitor 84 and ground. The audio signal may be taken from movable volume control tap 90 and coupled through coupling capacitor 91 to control grid 92 of audio amplifier 85. Audio amplifier 85 also has a cathode 94 and an anode 95 connected to the anode voltage supply +B through anode resistor 96. The amplified audio signal developed across anode resistor 96 is impressed through coupling capacitor 97 on audio amplifier 100 and may be reproduced by loud speaker 101.

The output signal of the ratio detector is utilized to obtain an indication of the amount and sense of mistuning of the receiver. To this end the output signal of the ratio detector is filtered by low-pass or audio filter network 103 comprising series resistor 104 connected to the junction point between de-emphasis network 83 and audio coupling capacitor 84, and shunt capacitor 105. The signal derived from filter network 103 is the mean voltage or direct-current voltage component of the rectified signal, that is, of the audio signal. This mean voltage will be zero only when the receiver is properly tuned, and will be either positive or negative when the receiver is tuned to a frequency above the assigned center frequency of secondary circuit 63 or below this assigned frequency, respectively.

This means voltage is now impressed on direct current amplifier 106 including cathode 107, control grid 108 and anode 110. Control grid 108 is connected to filter network 103. Anode 110 is connected to a suitable positive voltage supply indicated by +B through resistor 111, lead 112 and anode resistor 47. Cathode 107 is also connected to +B through resistor 113, lead 112 and resistor 47, and is connected to ground through cathode resistor 114 which may be adjustable as shown. Resistors 113 and 114 accordingly function as a voltage divider which will keep cathode 107 at a predetermined and adjustable positive voltage.

The control signal developed across anode resistor 111 is impressed on one of the control rods or vanes 49 of a double vane indicator tube 48 of the electric shadow type which may be a 6AF6 tube. Indicator 48 has a grounded cathode, two control rods 49, 51 and a fluorescent target 50 connected to +B through resistor 47, as shown. Control rod 49 is connected by lead 115 to the anode 110 of amplifier 106. The junction point between anode resistor 47 and target 50 is connected to control rod 51 through resistor 52, and control rod 51 is connected to ground through resistor 53. Resistors 52 and 53 accordingly form a voltage divider which will maintain control rod 51 at a predetermined positive voltage.

Control rod 51 and target 50 of indicator tube 48 are connected to the output of muting amplifier 120. The cathode 121 of muting amplifier 120 is grounded through resistor 122 and bypassed to ground by capacitor 123, while its control grid 124 is connected through resistor 125 to lead 78 which carries the AVC voltage. The cathode 121 of muting amplifier 120 is tied to the cathode 94 of audio amplifier 85, while the anode 126 of muting amplifier 120 is tied to target 50 of indicator tube 48.

Figure 4:
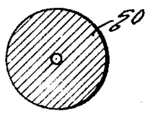
Figs. 4 to 7 are plan views of the target of the electronic shadow indicator tube included in the circuit of Fig. 2 which illustrate the appearance of the target when the receiver is mistuned (Figs. 4, 5 and 6) or properly tuned (Fig. 7)

The f-m receiver of Fig. 2 including the tuning indicator and muting circuit of the invention operates as follows. In the absence of a carrier wave no AVC signal is developed and accordingly muting amplifier 120 will conduct current. This is due to the fact that its control grid 124 is connected to the anode voltage supply +B through resistor 128 which, in turn, is connected to ground through resistors 125 and 75. Control grid 124 will accordingly have a potential which is sufficiently positive to render muting amplifier 120 conducting. The resulting voltage drop across anode resistor 47 will reduce the voltage of target 50 of indicator tube 48 to such an extent that the target will remain dark. At the same time, the space current of muting amplifier 120 will flow through its cathode resistor 122. This, in turn, will raise the potential of cathode 121 as well as that of cathode 94 of audio amplifier 85 which are tied together. Consequently, audio amplifier 85 will be biased to or beyond cut off. Target 50 of the tuning indicator 48 will remain dark as illustrated in Fig. 4.

When a carrier wave is received, an AVC signal is developed by the ratio detector which is impressed through resistor 125 on control grid 124 of muting amplifier 120. This voltage has been illustrated in Fig. 3 by curve 133 and varies as a function of the mistuning of the receiver. Accordingly, a negative AVC voltage is impressed on control grid 124 which will cut off muting amplifier 120. Hence, the space current of muting tube 120 will no longer flow through cathode resistor 122 so that the potential of both cathodes 121 and 94 will rise. Audio amplifier 85 is now in a condition to conduct space current and to amplify the audio signal impressed thereon. At the same time, the cutting off of muting amplifier 120 will raise the voltage of target 50 so that it can now attract electrons.

Figure 5:
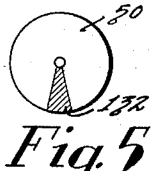

Let it now be assumed that tuning control knob 6 is so adjusted that the receiver is mistuned and the center frequency of the received f-m wave is lower than the assigned center frequency value $F_1$ of secondary circuit 63. In that case, the demodulated signal which is impressed on control grid 108 of amplifier 106 has a positive mean voltage as illustrated by curve 130 of Fig. 3. Curve 130 thus represents the voltage impressed on control grid 108 as a function of the tuning of the receiver. Since a positive voltage is impressed on amplifier 106 the amplifier will conduct more space current than normally with a correspondingly larger voltage drop across its anode resistor 111. The voltage impressed through lead 115 on control rod 49 of indicator 48 will therefore decrease. When the voltage of control rod 49 decreases, it will repel electrons and cast a shadow on target 50. The shadow 132 appearing on target 50 is illustrated in Fig. 5 and its angle is controlled by rod 49 to indicate the amount of mistuning of the receiver.

Figure 6:
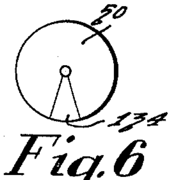

Let it now be assumed that tuning control knob 6 is so adjusted that the receiver is mistuned and the center frequency of the f-m wave is higher than the assigned center frequency value of secondary circuit 63. Now the mean voltage 130 of the audio signal is negative, and this negative voltage will be impressed upon control grid 108 of amplifier 106. The space current through amplifier 106 is thus reduced so that the voltage impressed through lead 115 on control rod 49 will rise. Control rod 49 will therefore attract electrons and an overlapping bright portion 134 which is brighter than the remainder of the target will appear on target 50 as shown in Fig. 6.

Figure 3:
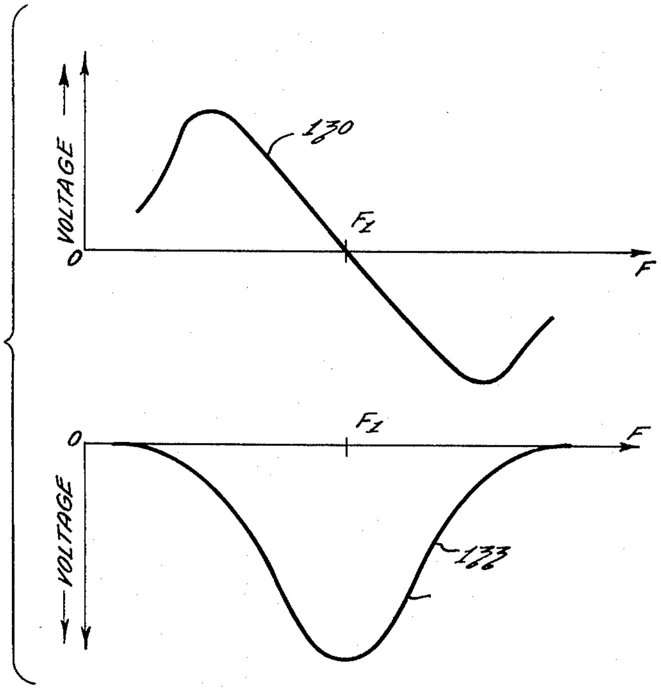
Fig. 3 is a graph illustrating voltages developed at different points of the receiver of Fig. 2.
Figure 7:
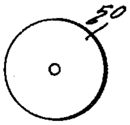

If tuning control knob 6 is adjusted so that the receiver is correctly tuned, the mean voltage 130 of the audio signal (at the frequency $F_1$) is zero as illustrated in Fig. 3. Accordingly, a voltage of zero magnitude is impressed upon control grid 108 of amplifier 106. Cathode resistor 114 is adjusted in such a manner that cathode 107 has a predetermined positive voltage. Under these conditions the space current of amplifier tube 106 is of such a magnitude that the voltage of control rod 49 is sufficient to cause either shadow 132 or overlapping bright portion 134 just to disappear. Target 50 accordingly will be uniformly illuminated as shown in Fig. 7. Muting amplifier 120 preferably has a low amplification factor so that the brightness of target 50 depends to a certain extent on the strength of the received carrier wave. In other words, unless the AVC voltage 133 illustrated in Fig. 3 exceeds a certain value, muting amplifier 120 will still conduct space current to a certain extent. The brightness of target 50 thus indicates the strength of a wave of marginal strength which is received.

It will be understood that the ratio detector which has been illustrated by way of example in Fig. 2 may be replaced by any conventional frequency discriminator. Furthermore, the AVC voltage which is impressed on muting amplifier 120 may also be derived in another conventional manner. Thus, it may be desired to derive the AVC voltage through a sharply tuned circuit so that audio amplifier 85 is only rendered conducting when the mistuning of the receiver is less than a predetermined amount.

It is also to be understood that a muting and tuning indicator circuit of the type illustrated in Fig. 2 may be incorporated in an a-m receiver. Such a circuit has been illustrated in Fig. 8 to which reference is now made. The a-m receiver of Fig. 8 comprises an i-f output circuit 8 which may be connected to i-f amplifier 7 of Fig. 1. I-f circuit 8 comprises coil 135 inductively coupled to input circuit 10 of the detector. The detector comprises diode 12, 13 having a load circuit 16 across which the audio signal is developed. The audio signal is then impressed upon control grid 14 of the audio amplifier in the manner explained in connection with Fig. 1.

Muting amplifier 35 has its cathode 36 tied to cathode 12 of the audio amplifier. Both cathodes are connected to ground through self-bias network 20. Control grid 37 of muting amplifier 35 is biased at a predetermined voltage derived from voltage divider 42, 43. Anode 38 of muting amplifier 35 and target 50 of indicator 48 are also connected together. It will accordingly be obvious that the audio amplifier is controlled by muting amplifier 35 in the manner explained in connection with Fig. 1, while the target 50 of indicator 48 becomes bright as soon as a carrier wave is received and demodulated. Furthermore, the audio channel of the circuit of Fig. 8 will not open in response to intermittent noise pulses as previously explained.

Figure 8:
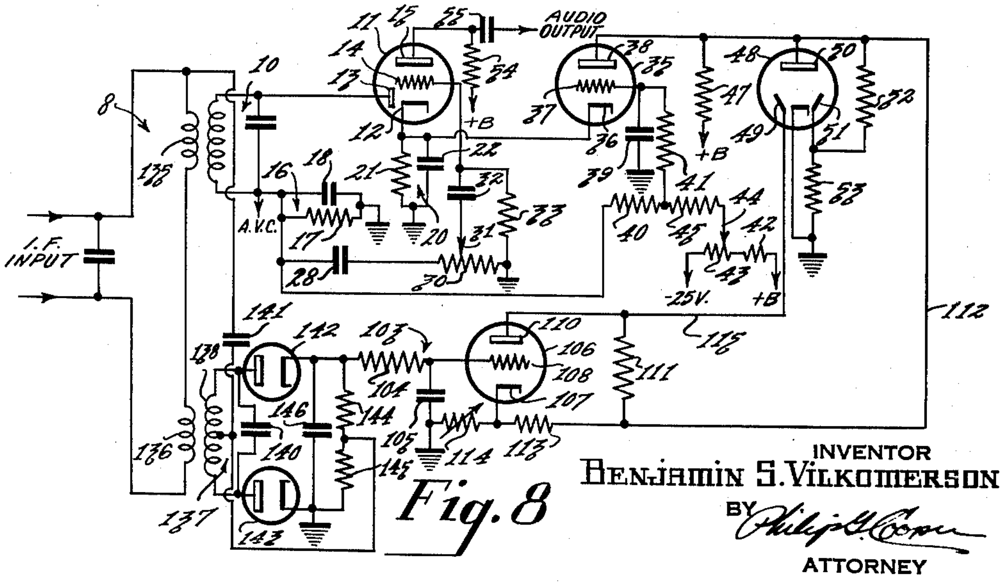
Fig. 8 is a circuit diagram of a portion of an a-m receiver embodying a modified muting and tuning indicator circuit in accordance with the invention.

However, the circuit of Fig. 8 differs from that of Fig. 1 in that control rod 49 is not tied to control rod 51 of indicator tube 48 but is made responsive to the amount and sense of mistuning of the receiver. To this end i-f circuit 8 is provided with a second coil 136 which is coupled to frequency discriminator network 137 of a Seeley frequency discriminator which has been disclosed and claimed in U. S. Patent 2,121,103. The frequency discriminator network 137 includes coil 138 tuned by capacitor 140. The midpoint of coil 138 is connected through capacitor 141 to the high alternating potential terminal of i-f circuit 8.

Frequency discriminator network 137 functions in a well known manner. A primary or reference voltage is injected into the secondary circuit 138, 140 through capacitor 141. At the same time a secondary voltage is developed at each terminal of the circuit 138, 140. Since the phase of the two secondary voltages with respect to the primary voltage varies with the difference in frequency of the impressed i-f wave and the resonant frequency of circuit 138, 140, a resultant wave is developed at each terminal of the circuit which has an amplitude representative of this phase difference, which, in turn, is responsive to the frequency difference. The two waves are now rectified by diodes 142, 143 having their anodes connected to respective terminals of secondary circuits 138, 140. The cathodes of diodes 142, 143 are interconnected through load resistors 144, 145 which are bypassed by capacitor 146 having a low impedance to intermediate-frequency currents. The cathode of diode 143 is grounded while the junction point of load resistor 144, 145 is connected to the midpoint of coil 138.

The voltage developed across load resistors 144, 145 is integrated or filtered by filter network 103 in the manner explained in connection with Fig. 2. Accordingly, the voltage impressed on control grid 108 of direct current amplifier 106 is represented by curve 130 of Fig. 3. Anode 110 of amplifier 106 is connected by lead 115 to control rod 49 as explained in connection with Fig. 2. Control rod 49 will accordingly cast a shadow (Fig. 5) or a bright overlapping portion (Fig. 6) on target 50 when the receiver is mistuned above or below the correct frequency. When the receiver is properly tuned target 50 will appear as shown in Fig. 7. The interchannel noise suppressor and tuning indicator circuit of Fig. 8 will accordingly give the same tuning indication as that of Fig. 2. The circuits of Figs. 2 and 8 can accordingly be combined to obtain an a-m and f-m receiver where identical tuning indications can be observed on the target 50 of indicator tube 48 whether an a-m or an f-m wave is received. It will be obvious that since control rod 51 of indicator 48 is not required in the circuits of Figs. 1, 2 and 8 it may be omitted.

It will be understood that the circuit specifications of the interchannel noise suppressor and tuning indicator circuit of the invention may vary according to the design for any particular application. The following circuit specifications are included, by way of example only, for the circuit of Fig. 1;

| | |
|---|---|
| Diode-triode amplifier 11 | 6AV6 type |
| Muting amplifier 35 | 6AG5 type (connected as a triode) |
| Tuning indicator tube 48 | 6AF6 type |
| Resistor 24 | 1,000,000 ohms |
| Resistor 26 | 15,000,000 ohms |
| Resistor 17 | 270,000 ohms |
| Resistor 21 | 1,200 ohms |
| Resistor 54 | 270,000 ohms |
| Resistor 30 | 1,500,000 ohms |
| Resistor 33 | 15,000,000 ohms |
| Resistor 42 | 270,000 ohms |
| Resistor 43 | 2,000,000 ohms |
| Resistor 45 | 10,000,000 ohms |
| Resistor 40 | 1,000,000 ohms |
| Resistor 41 | 1,000,000 ohms |
| Resistor 47 | 24,000 ohms |
| Resistor 52 | 560,000 ohms |
| Resistor 53 | 390,000 ohms |
| Capacitor 18 | 100 micromicrofarads |
| Capacitor 22 | 5 microfarads |
| Capacitor 28 | .01 microfarad |
| Capacitor 32 | .01 microfarad |
| Capacitor 39 | .1 microfarad |
| Capacitor 55 | .01 microfarad |

The following are illustrative circuit specifications for the circuit of Fig. 2:

| | |
|---|---|
| Diodes 72, 73 | 6AL5 |
| Muting amplifier 120 | 6AG5 (connected as a triode) |
| Tuning indicator tube 48 | 6AF6 |
| Audio amplifier 85 | 6AV6 |
| Amplifier 106 | 6Aμ6 (connected as a triode) |
| Resistor 86 | 15,000 ohms |
| Resistor 88 | 1,500,000 ohms |
| Resistor 93 | 15,000,000 ohms |
| Resistor 96 | 270,000 ohms |
| Resistor 75 | 10,000 ohms |
| Resistor 76 | 10,000 ohms |
| Resistor 125 | 220,000 ohms |
| Resistor 128 | 8,200,000 ohms |
| Resistor 122 | 680 ohms |
| Resistor 47 | 24,000 ohms |
| Resistor 52 | 560,000 ohms |
| Resistor 53 | 390,000 ohms |
| Resistor 104 | 1,000,000 ohms |
| Variable Resistor 114 | zero to 5,000 ohms |
| Resistor 113 | 220,000 ohms |
| Resistor 111 | 1,000,000 ohms |
| Capacitor 74 | 5 microfarads |
| Capacitor 77 | 100 micromicrofarads |
| Capacitor 87 | .005 microfarad |
| Capacitor 84 | .01 microfarad |
| Capacitor 91 | .01 microfarad |
| Capacitor 123 | 5 microfarads |
| Capacitor 97 | .01 microfarad |
| Capacitor 105 | .1 microfarad |

The circuit constants of the circuit of Fig. 8 may be the same as those of corresponding components of the circuits of Figs. 1 and 2 as given above.

There has thus been described an interchannel noise suppressor or muting circuit which may be used with an a-m or f-m receiver. The muting circuit for an a-m receiver will suddenly render the audio channel conducting when a wave of predetermined average amplitude is received. The audio channel will not open on intermittent noise pulses of high amplitude. On the other hand, the audio channel will not close when it has been opened by an a-m carrier wave when the amplitude of the carrier wave momentarily decreases. The muting amplifier of the noise suppressor circuit may serve the additional function of rendering a tuning indicator tube operative or inoperative. Furthermore, the tuning indicator circuit may include a frequency discriminator and amplifier for obtaining a visual indication of the sense and magnitude of the mis-tuning of the receiver.

What is claimed is:

1. An angle-modulated carrier wave receiver comprising a carrier wave transmission channel, a frequency discriminator coupled to said channel and having an output circuit for developing the modulation signal including a component representative of the sense and amount of frequency departure of the center frequency of said wave from a predetermined frequency, means for separating said component from said signal, circuit means coupled to said discriminator for deriving a control voltage representative of the presence or absence of a carrier wave received by said receiver, a modulation signal amplifier coupled to said output circuit for amplifying said modulation signal, a first control amplifier responsive to said component, a second control amplifier responsive to said control voltage and arranged to be conducting in the absence of a carrier wave, said modulation signal amplifier having a higher amplification factor than said second control amplifier, said signal amplifier and said second control amplifier having each a cathode, said cathodes being connected together, an impedance element in the common cathode circuit of said signal amplifier and said second control amplifier, said signal amplifier being arranged to be non-conducting in the absence of a carrier wave, whereby the presence of a carrier wave will cause said second control amplifier to be cut off and will render said signal amplifier conducting, an electronic indicator device arranged to be inoperative in the absence of a carrier wave and coupled to said first control amplifier, and a circuit connection between said second control amplifier and said device to render said device operative when said second control amplifier is cut off.

2. An angle-modulated carrier wave receiver comprising a carrier wave transmission channel, a frequency discriminator coupled to said channel and having an output circuit for developing the modulation signal whose mean voltage is proportional in polarity and magnitude to the sense and amount of frequency departure of the center frequency of said wave from the assigned center frequency of said discriminator, a filter network coupled to said output circuit for deriving said mean voltage from said signal, circuit means coupled to said discriminator for deriving a control voltage representative of the presence or absence of a carrier wave received by said receiver, a modulation signal amplifier coupled to said output circuit for amplifying said modulation signal, a first control amplifier responsive to said mean voltage, a second control amplifier having an amplification factor that is lower than that of said signal amplifier and responsive to said control voltage and arranged to be conducting in the absence of a carrier wave, said signal amplifier and said second control amplifier having each a cathode, said cathodes being connected together, an impedance element in the common cathode circuit of said signal amplifier and said second control amplifier, said signal amplifier being arranged to be non-conducting in the absence of a carrier wave, whereby the presence of a carrier wave will cause said second control amplifier to be cut off and will render said signal amplifier conducting, an electronic indicator device coupled to said first control amplifier for indicating the magnitude and polarity of said mean voltage, said device being arranged to be inoperative in the absence of a carrier wave, and a circuit connection between said second control amplifier and said device to render said device operative when said second control amplifier is cut off.

3. A frequency-modulated carrier wave receiver comprising a carrier wave transmission channel, a frequency discriminator coupled to said channel and having an output circuit for developing the modulation signal whose mean voltage is proportional in polarity and magnitude to the sense and amount of frequency departure of the center frequency of said wave from the assigned center frequency of said discriminator, a filter network coupled to said output circuit for deriving said mean voltage from said signal, circuit means coupled to said discriminator for deriving an automatic gain control voltage representative of the presence or absence of a carrier wave received by said receiver, a modulation signal amplifier coupled to said output circuit for amplifying said modulation signal, a first control amplifier responsive to said mean voltage, a second control amplifier having a lower amplification factor than that of said signal amplifier and a high mutual conductance and responsive to said control voltage and arranged to be conducting in the absence of a carrier wave, said signal amplifier and said second control amplifier having each a cathode, said cathodes being connected together, an impedance element in the common cathode circuit of said signal amplifier and said second control amplifier, said signal amplifier being arranged to be non-conducting in the absence of a carrier wave, whereby the presence of a carrier wave will cause said second control amplifier to be cut off and will render said signal amplifier conducting, an electronic indicator tube having a control element and a target, said control element being coupled to said first control amplifier for visually indicating the magnitude and polarity of said mean voltage, said tube being arranged to be inoperative in the absence of a carrier wave, and a circuit connection between said second control amplifier and said target to render said tube operative when said second control amplifier is cut off.

BENJAMIN S. VILKOMERSON.

REFERENCES CITED

The following references are of record in the file of this patent:

UNITED STATES PATENTS

| Number | Name | Date |
|---|---|---|
| 2,078,055 | Carlson et al. | Apr. 20, 1937 |
| 2,096,874 | Beers | Oct. 26, 1937 |
| 2,172,477 | Lett | Sept. 12, 1939 |
| 2,261,643 | Brown | Nov. 4, 1941 |
| 2,263,633 | Koch | Nov. 25, 1941 |
| 2,273,098 | Foster | Feb. 17, 1942 |
| 2,334,473 | Carlson | Nov. 16, 1943 |
| 2,447,309 | Blaisdell | Aug. 17, 1948 |
| 2,451,584 | Stone | Oct. 19, 1948 |
| 2,501,120 | Carlson | Mar. 21, 1950 |